(12) United States Patent
Chen et al.

(10) Patent No.: US 9,529,281 B2
(45) Date of Patent: Dec. 27, 2016

(54) MASK-MOUNTING APPARATUS FOR EXPOSURE MACHINE

(71) Applicants: BOE TECHNOLOGY GROUP CO., LTD., Beijing (CN); BEIJING BOE DISPLAY TECHNOLOGY CO., LTD., Beijing (CN)

(72) Inventors: Run Chen, Beijing (CN); Jintao Xiao, Beijing (CN); Zhenyuan Zhou, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/361,447

(22) PCT Filed: Apr. 28, 2013

(86) PCT No.: PCT/CN2013/074949
§ 371 (c)(1),
(2) Date: May 29, 2014

(87) PCT Pub. No.: WO2014/121564
PCT Pub. Date: Aug. 14, 2014

(65) Prior Publication Data
US 2016/0091802 A1 Mar. 31, 2016

(30) Foreign Application Priority Data
Feb. 6, 2013 (CN) .......................... 2013 1 0048017

(51) Int. Cl.
*G03F 7/20* (2006.01)

(52) U.S. Cl.
CPC .......... *G03F 7/70816* (2013.01); *G03F 7/708* (2013.01); *G03F 7/70691* (2013.01);
(Continued)

(58) Field of Classification Search
CPC .. G03F 7/707; G03F 7/70733; G03F 7/70991; G03F 7/70691; G03F 7/70716; G03F 7/708; G03F 7/70808; G03F 7/70816; G03F 7/70825; G03F 7/70833; G03F 7/70975
See application file for complete search history.

(56) References Cited

U.S. PATENT DOCUMENTS

2010/0021577 A1 1/2010 Stewart et al.

FOREIGN PATENT DOCUMENTS

| CN | 1668983 A | 9/2005 |
|---|---|---|
| CN | 101019209 A | 8/2007 |

(Continued)

OTHER PUBLICATIONS

Second Chinese Office Action Appln No. 201310048017.X; Dated Jan. 13, 2015.

(Continued)

*Primary Examiner* — Toan Ton
*Assistant Examiner* — Michelle M Iacoletti
(74) *Attorney, Agent, or Firm* — Ladas & Parry LLP

(57) ABSTRACT

A mask-mounting apparatus for an exposure machine, which comprises: a mask frame (8) for securing a mask (9); a gas cell (6, 7) provided beneath the mask frame (8) for supporting the mask frame (8); and a gas-supply unit communicating through a gas-supply pipeline with the gas cell (6, 7); the gas-supply pipeline is provided thereon with a pneumatic switch valve (10, 11). In the event of interruption of supply from the gas-supply unit, the pneumatic switch valve shuts off the gas-supply pipeline to prevent the gas cell from being deflated. With provision of a pneumatic switch valve on the gas-supply pipeline connected with the gas cell, it can be achieved that, after an interruption of the supply from the gas-supply unit, the pneumatic switch valve auto- (Continued)

matically switches to a non-energized state, thus sealing the gas in the gas cell, and avoiding the detachment of the mask frame caused by deflation of the gas cell. After the normal supply of the gas-supply unit, the pneumatic switch valve controls the gas-supply pipeline to continue supplying gas to the gas cell, thus avoiding the risks of detachment of the mask frame caused by the interruption of the supply of the gas-supply unit.

20 Claims, 3 Drawing Sheets

(52) U.S. Cl.
CPC ...... *G03F 7/70716* (2013.01); *G03F 7/70808* (2013.01); *G03F 7/70825* (2013.01); *G03F 7/707* (2013.01); *G03F 7/70991* (2013.01)

(56) References Cited

FOREIGN PATENT DOCUMENTS

| CN | 10135209 A | 2/2009 |
| CN | 102563330 A | 7/2012 |
| CN | 102486215 A | 2/2014 |
| JP | 2001-117238 A | 4/2001 |
| JP | 2010-040831 A | 2/2010 |

OTHER PUBLICATIONS

Korean Office Action Appln. No. 10-2014-7017328; Dated Dec. 14, 2015.
Korean Office Action dated Jun. 27, 2016; Appln. No. 10-2014-7017328.
First Chinese Office Action dated May 16, 2014; Appln. No. 201310048017.X.
Written Opinion dated Nov. 6, 2016; PCT/CN2013/074949.
Korean Office Action dated Aug. 11, 2016, Appln. No. 10-2014-7017328.

MASK-MOUNTING APPARATUS FOR EXPOSURE MACHINE

TECHNICAL FIELD

Embodiments of the present invention relate to a mask-mounting apparatus for an exposure machine, which can prevent detachment of a mask frame.

BACKGROUND

A mask (reticle) is an important component in an exposure equipment, which needs to be held and supported by a certain means in operation. As illustrated in FIG. 1, a mask 9 is mounted on a mask frame 8 of an exposure equipment, and the mask frame 8 is in a square frame structure; the mask 9 is located at a central position of the mask frame 8, and the stability of the mask 9 is ensured by an adsorption or support structure at the upper and lower edge regions of the mask 9. Specifically, the mask frame 8 is provided thereon with a negative-pressure unit for adsorbing the upper edge region of the mask 9; at the lower edge region of the mask 9, a support portion is provided for supporting the mask 9; when the negative-pressure unit is interrupted, the support portion supports the mask 9, to ensure the reliable security of the mask 9; the support portion is connected with a cylinder piston, and the cylinder piston extends and retracts so as to drive the support portion to move.

Further, the mask frame 8 is supported by a plurality of gas cells (gas packages), such as a first gas cell 6 and a second gas cell 7 indicated in FIG. 1. When the mask 9 is in a normal state, a compressed-dry-air (CDA) supply unit communicating with the gas cells supplies gas to the gas cells; the gas cells support beneath the mask frame 8, thus maintaining the security state of the mask 9. The gas cells are divided into four groups, and provided beneath the four rims of the mask frame 8 respectively; a branch gas-supply pipeline between the CDA supply unit and each group of the gas cells is provided thereon with a pressure-reducing valve and a pressure gauge, such as a first pressure-reducing valve 4 or a first pressure gauge 5 illustrated in FIG. 1; a master gas-supply pipeline at its end proximate to the CDA supply unit is provided thereon with a vent valve 1, a master pressure-reducing valve 2 and a master pressure gauge 3, so that the pressure-reducing valve and the pressure gauge ensures the security of gas supply and ensures that the pressure of the supplied compressed gas can meet the needs. The CDA supply unit, in addition to supplying gas to the gas cells, also provides power source to the above-mentioned cylinder. However, the above structure has drawbacks as follows: once abnormal supply of the CDA supply unit or the negative-pressure unit occurs, it will cause deflation of the gas cells, retraction of the cylinder piston, or lose of the adsorbing force of the negative-pressure unit, resulting in detachment of the mask frame as well as detachment and damages of the mask, which is a very severe loss.

SUMMARY

The technical problem to be solved by the present invention is to avoid the problem of damages to a mask due to abnormal supply of the CDA supply unit and the negative-pressure unit in a mask-mounting apparatus.

To solve the above-mentioned technical problems, an embodiment of the present invention provides a mask-mounting apparatus for an exposure machine, which comprises: a mask frame for securing a mask; a gas cell provided beneath the mask frame, configured for supporting the mask frame; a gas-supply unit communicating through a gas-supply pipeline with the gas cell; the gas-supply pipeline is provided thereon with a pneumatic switch valve, so that, in the event of interruption of supply from the gas-supply unit, the pneumatic switch valve shuts off the gas-supply pipeline, to prevent the gas cell from being deflated.

For example, a plurality of gas cells is provided spacedly beneath the mask frame.

For example, the gas-supply pipeline comprises: a control pipeline and a plurality of branch gas-supply pipelines; the plurality of branch gas-supply pipelines communicate with the gas cell(s), and the control pipeline communicates with the gas-supply unit and the plurality of branch gas-supply pipelines; the pneumatic switch valve is provided on the control pipeline or on the plurality of branch gas-supply pipelines, or provided simultaneously on the control pipeline and on the plurality of branch gas-supply pipelines.

For example, the control pipeline is further provided thereon with a vent valve, a master pressure-reducing valve and a master pressure gauge.

For example, the vent valve, the master pressure-reducing valve and the master pressure gauge are provided at the end of the control pipeline proximate to the gas-supply unit; the master pneumatic switch valve is provided at the end of the control pipeline proximate to the gas cell.

For example, the branch gas-supply pipelines are further provided thereon with a pressure-reducing valve and a pressure gauge.

For example, the pressure-reducing valve and the pressure gauge are provided at the end of the branch gas-supply pipeline proximate to the gas-supply unit; a branch pneumatic switch valve is provided at the end of the branch gas-supply pipeline proximate to the gas cell.

For example, the mask-mounting apparatus for an exposure machine further comprises a support portion, the support portion is provided at a lower edge of the mask, configured for supporting the mask; the support portion is connected through a link rod to a piston of a cylinder, in which, the cylinder is a self-locking cylinder, moreover, extension and retraction activities of the cylinder piston pulls the support portion to approach to or to depart from the mask.

For example, the cylinder is supplied with compressed gas by the gas-supply unit.

For example, the mask frame is provided therein with a vacuum adsorption holder for securing the mask.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
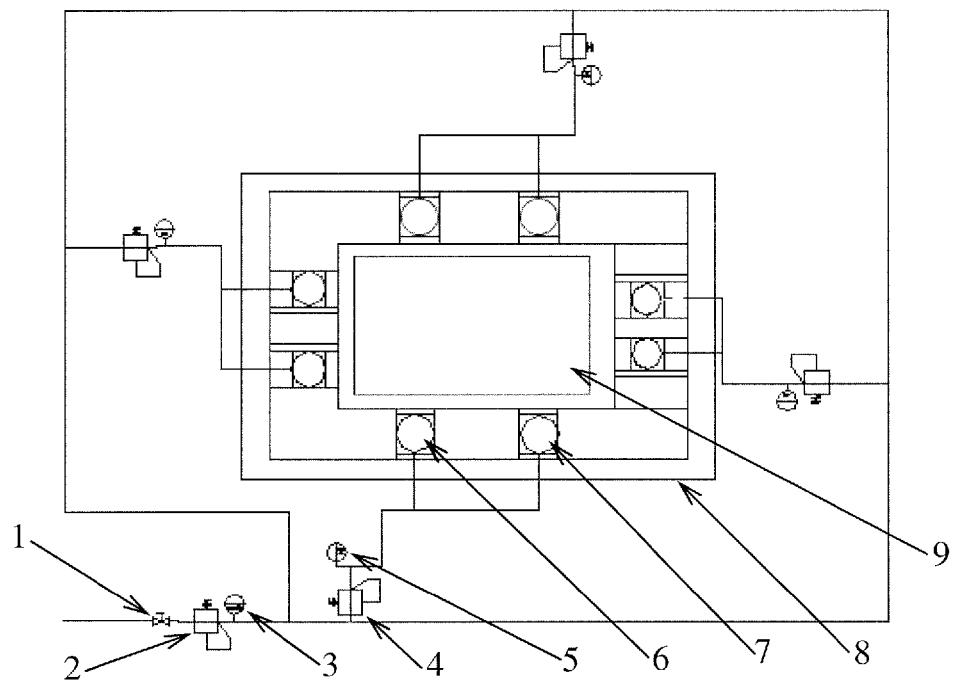
FIG. 1 is a schematic block diagram of a mask-mounting apparatus for a conventional exposure machine.
Figure 2:
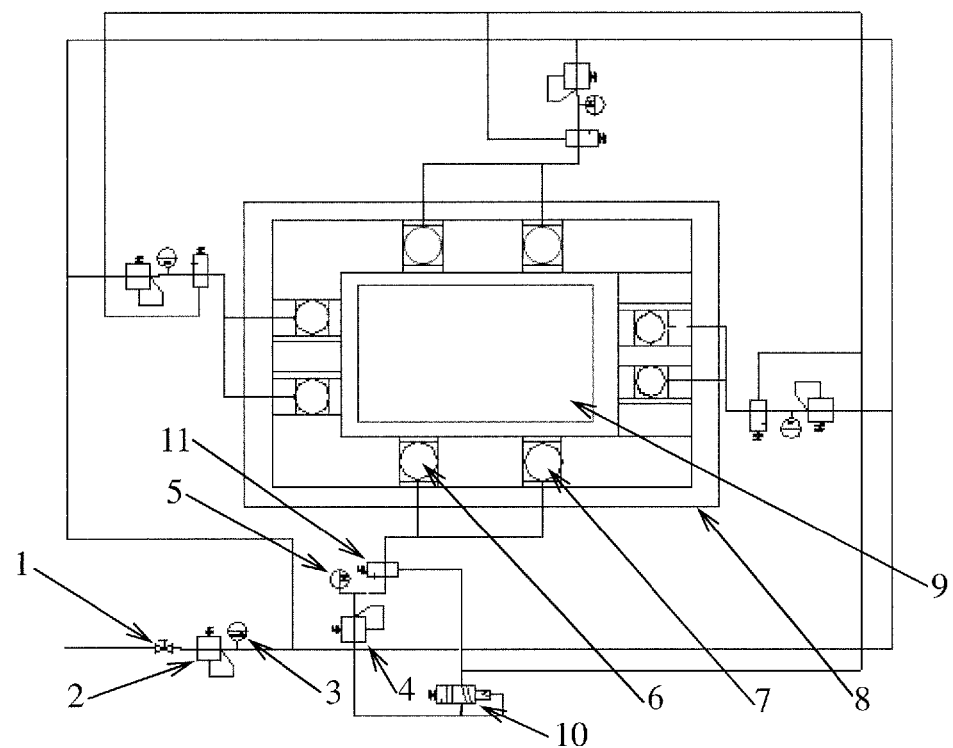
FIG. 2 is a schematic block diagram of a mask-mounting apparatus for an exposure machine in accordance with an embodiment of the present invention.
Figure 3:
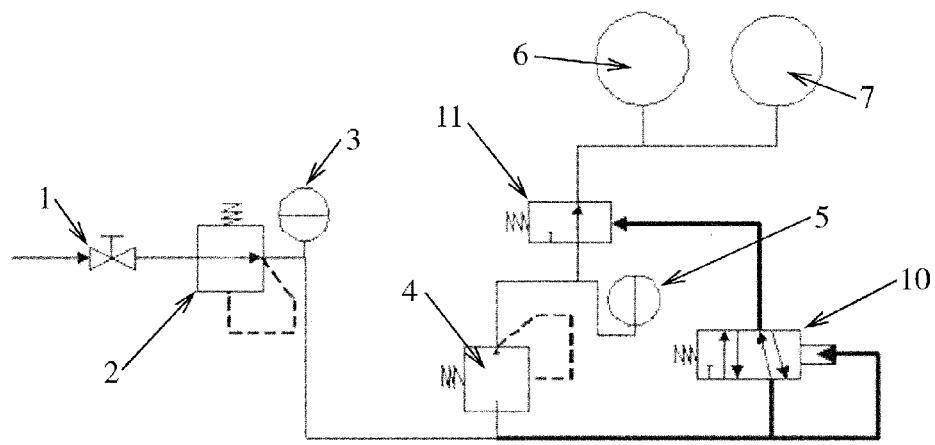
FIG. 3 is an enlarged view of a part of the structure illustrated in FIG. 2.
Figure 4:
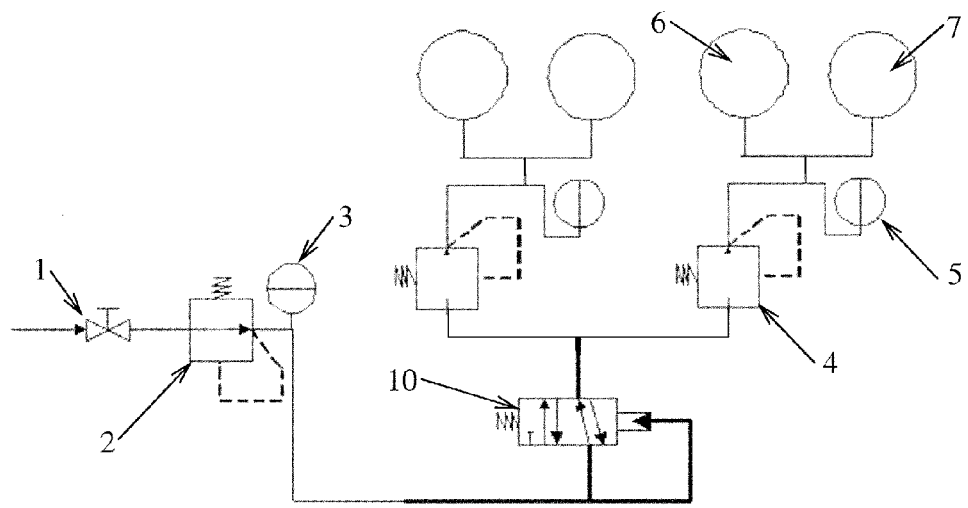
FIG. 4 is an enlarged view corresponding to FIG. 3 in a mask-mounting apparatus for an exposure machine in accordance with another embodiment of the present invention.

FIG. 2 illustrates a schematic block diagram of a mask-mounting apparatus for an exposure machine in accordance with an exemplary embodiment of the present invention. FIG. 3 is an enlarged view of a part of the structure illustrated in FIG. 2. FIG. 4 is a schematic diagram of a structure for preventing detachment of a mask. With reference to FIG. 2 and FIG. 3, in this embodiment, the mask-mounting apparatus for an exposure machine comprises: a mask frame 8 for securing a mask 9; a plurality of gas cells provided beneath the mask frame 8, for supporting the mask frame 8; and a gas-supply unit (not illustrated in the figures) communicating with the gas cells; the gas-supply unit may be a CDA supply unit; a gas-supply pipeline communicating between the gas-supply unit and the gas cells is provided thereon with a pneumatic switch valve, so that, in the event of interruption of supply from the gas-supply unit, the pneumatic switch valve controls to shut off the gas-supply pipeline, to prevent the gas cell from being deflated, so as to avoid detachment of the mask frame 8.

Typically, there are provided a plurality of gas cells, and the plurality of gas cells are spacedly provided beneath the mask frame 8, such as the first gas cell 6 and the second gas cell 7 illustrated in the figures. The gas-supply pipeline communicating between the gas cells and the gas-supply unit comprises: a control pipeline and a plurality of branch gas-supply pipelines; the branch gas-supply pipelines communicate with the gas cells, and the control pipeline communicates with the gas-supply unit and the branch gas-supply pipelines. The gas from the gas-supply unit is supplied, firstly through the control pipeline, then through each branch gas-supply pipeline, to each gas cell. In order to avoid occurrence of gas reverse flow due to deflation of the gas cells in the event of interruption of the supply of the gas-supply unit, the pneumatic switch valve may be provided alone on the control pipeline, or provided alone on the branch gas-supply pipelines, or provided simultaneously on the control pipeline and on the branch gas-supply pipelines.

Below, by taking the case as an example where the pneumatic switch valve is provided simultaneously on the control pipeline and on the branch gas-supply pipelines, the structure and the working principle will be described.

In this example, the pneumatic switch valve on the gas-supply pipeline comprises: a first branch pneumatic switch valve 11 and a master pneumatic switch valve 10, as illustrated in the figure; in the case that the supply of the gas-supply unit is in normal operation, high-pressure compressed gas can open up the master pneumatic switch valve 10, so that the master pneumatic switch valve 10 is in the "ON" state, and the high-pressure compressed gas further goes to each branch pneumatic switch valve, thus opening up each branch pneumatic switch valve, so that each branch pneumatic switch valve is in the "ON" state; in this situation, the switch valves on the gas-supply pipeline connecting from the gas-supply unit to each gas cell, are all opened up, so that the gas supply is unhindered. In the case that an interruption of the supply of the gas-supply unit occurs, there is no high-pressure compressed gas, and therefore, the master pneumatic switch valve 10 and each branch pneumatic switch valve all can not be opened up but in the "OFF" state, and the gas within the gas cells is also sealed by each branch pneumatic switch valve, with no deflation, which can ensure that the gas cells properly support beneath the mask frame 8, and thus the detachment of the mask frame 8 will not occur.

The control pipeline at its end proximate to the gas-supply unit is provided thereon with a vent valve 1, a master pressure-reducing valve 2 and a master pressure gauge 3; the vent valve 1 is located between the master pressure-reducing valve 2 and the gas-supply unit; the master pneumatic switch valve 10 is provided on the control pipeline at the end thereof proximate to the gas cells. With the vent valve 1, the master pressure-reducing valve 2 and the master pressure gauge 3, an ON-OFF control and real-time pressure monitoring of the gas-supply unit is achieved, thus ensuring that the compressed gas going to the master pneumatic switch valve 10 and each gas cell can meet the required pressure target. Each branch gas-supply pipeline is further provided thereon with a pressure-reducing valve and a pressure gauge, such as a first branch pressure-reducing valve 4 and a first branch pressure gauge 5 as illustrated in the figure; the pressure-reducing valve and the pressure gauge are provided on the branch gas-supply pipeline at the end thereof proximate to the gas-supply unit; the branch pneumatic switch valve is provided on the branch gas-supply pipeline at the end thereof proximate to the gas cells; the pressure-reducing valve and the pressure gauge implement real-time monitoring of the pressure index of the gas supplied by the gas-supply unit to the gas cells.

Figure 5:
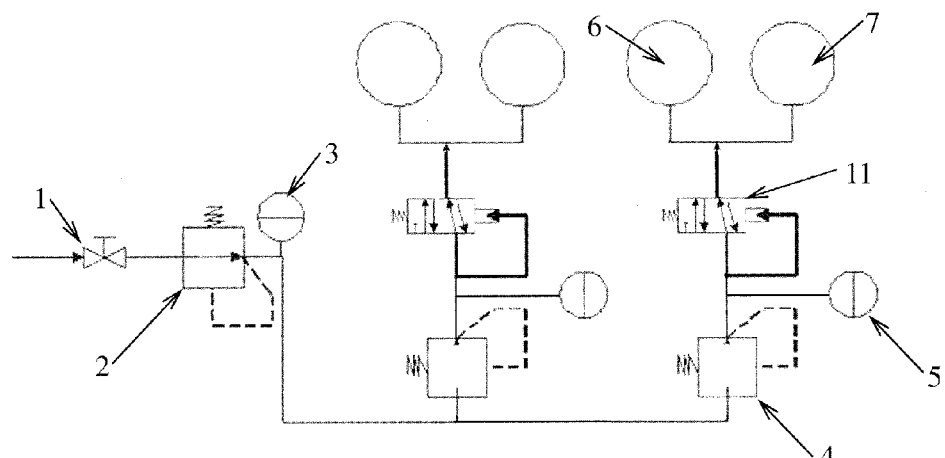
FIG. 5 is an enlarged view corresponding to FIG. 3 in a mask-mounting apparatus for an exposure machine in accordance with further another embodiment of the present invention.
Figure 6:
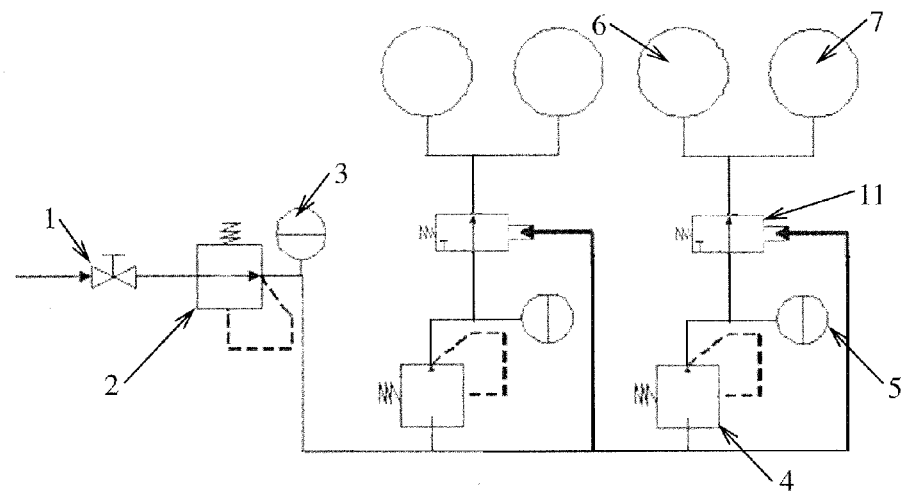
FIG. 6 is an enlarged view corresponding to FIG. 3 in a mask-mounting apparatus for an exposure machine in accordance with yet another embodiment of the present invention.

The provision of the above-described master pneumatic switch valve 10 and each branch pneumatic switch valve can avoid the risks of detachment of the mask frame 8, which is caused by an interruption of the supply of the gas-supply unit; moreover, the dual-provision of the pneumatic switch valve can more effectively ensure no occurrence of gas reverse flow due to deflation of the gas cells, and can obtain a more significant effect when applied for a heavier mask frame structure. Meanwhile, according to actual situations, in condition that the weight of the mask frame structure is not too great, it is also possible to adopt the above-mentioned setting in which the pneumatic switch valve is provided alone on the control pipeline or provided alone on the branch gas-supply pipelines, which can also ensure that, in the event of interruption of supply from the gas-supply unit, the pneumatic switch valve shuts off the gas-supply pipeline, thus preventing the gas cells from being deflated. A schematic block diagram of the setting that the pneumatic switch valve is provided alone on the control pipeline is as illustrated in FIG. 4, in which, the set position of the pneumatic switch valve is the same as the set position of the master pneumatic switch valve 10 described above, and in this case, each branch gas-supply pipeline can be provided thereon with the pressure-reducing valve and the pressure gauge only; a schematic block diagram of the setting that the pneumatic switch valve is provided alone on the branch gas-supply pipelines is as illustrated in FIG. 5 or FIG. 6, in which, the set position of the pneumatic switch valve is the same as the set position of the branch pneumatic switch valve described above, and in this case, the control pipeline can be provided thereon with the vent valve 1, the master pressure-reducing valve 2 and the master pressure gauge 3 only.

Figure 7:
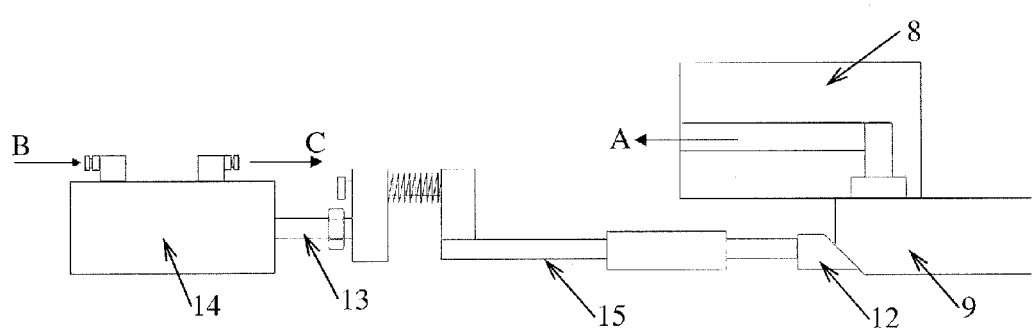
FIG. 7 is schematic diagram of a structure for preventing detachment of a mask, in a mask-mounting apparatus for an exposure machine in accordance with an embodiment of the present invention.

Further, as illustrated in FIG. 7, the mask-mounting apparatus for an exposure machine, according to this embodiment, further comprises: a support portion 12 provided at a lower edge of the mask 9, for supporting the mask 9; the support portion 12 is connected to a piston 13 of a cylinder via a link rod 15; the cylinder may be a self-locking cylinder 14, which is supplied with compressed gas by the gas-supply unit, as denoted by B and C in the figure; the extension and retraction activities of the cylinder piston 13 pulls the support portion 12 to approach to or to depart from the mask 9. The mask 9 is typically secured by the adsorption function of a vacuum adsorption holder of the negative-pressure unit located at the upper portion, and the negative-pressure unit performs vacuum adsorption at a location denoted by A in FIG. 6, thus achieving the adsorption function to the mask 9. In the event of an interruption of the adsorption of the negative-pressure unit, the mask 9 is secured by the support function of the support portion 12 located at the lower portion, and the support portion 12 at the lower portion, under the action of the cylinder piston 13 of the self-locking cylinder 14, achieves the support function to the mask 9; the self-locking cylinder 14 is supplied with compressed gas from the gas-supply unit, and once an interruption of the supply of the gas-supply unit occurs, the self-locking function of the self-locking cylinder 14 can prevent retraction of the cylinder piston 13, and continue to maintain the support portion 12 to support beneath the mask 9, so as to avoid the detachment of the mask 9 due to an simultaneous interruption of the supply of both the negative-pressure unit and the gas-supply unit.

In order to achieve that the gas-supply unit can continue gas supply after an interruption, it should be ensured that the above-described pneumatic switch valve has excellent air-tightness and at the same time the pneumatic switch valve can be opened up as the gas-supply unit continues gas supply; moreover, it should be ensured that the self-locking cylinder has sufficient locking force, and that the self-locking cylinder can be unlocked as the gas-supply unit continues gas supply.

As can be seen from the above embodiments, with a pneumatic switch valve on the gas-supply pipeline connected with the gas cells, the present invention can achieve the effect that, after an interruption of the supply from the gas-supply unit, the pneumatic switch valve automatically switches to a non-energized state, thus preventing gas reverse flow from the gas cells, and avoiding detachment of the mask frame that is caused by deflation of the gas cells. After the normal supply of the gas-supply unit, the pneumatic switch valve controls the gas-supply pipeline to continue supplying gas to the gas cells, thus avoiding the risks of detachment of the mask frame caused by the interruption of the supply of the gas-supply unit, and preventing damage to the mask. Further, by providing at lower edges of the mask with a support portion controlled by a self-locking cylinder, the present invention achieves the effect that, in the event of an interruption of the negative pressure supply, the self-locking cylinder locks the cylinder piston, so that the support portion will not leave from the mask, thus preventing detachment of the mask. The self-locking cylinder is driven by the gas-supply unit; therefore, without gas supply, the lock will not be released, and after the normal operation of the negative pressure and gas supply, the lock will be automatically released.

The above description are only intended to be illustrative but not limitative of the present invention; the skilled in the art will appreciate that, without departing from the spirit and scope defined by the claims, a variety of modifications, variations or equivalents can be made, which should all fall within the scope of the present invention.

The invention claimed is:

1. A mask-mounting apparatus for an exposure machine, comprising:
   a mask frame for securing a mask;
   a gas cell provided beneath the mask frame and configured for supporting the mask frame; and
   a gas-supply unit communicating through a gas-supply pipeline with the gas cell;
   wherein the gas-supply pipeline is provided thereon with a pneumatic switch valve, configured to automatically shut off the gas-supply pipeline in the event of interruption of supply from the gas-supply unit, to prevent the gas cell from being deflated.

2. The mask-mounting apparatus for an exposure machine according to claim 1, comprising a plurality of gas cells that are spacedly provided beneath the mask frame.

3. The mask-mounting apparatus for an exposure machine according to claim 2, wherein the gas-supply pipeline comprises: a control pipeline and a plurality of branch gas-supply pipelines, the branch gas-supply pipelines communicate with the gas cells, and the control pipeline communicates with the gas-supply unit and the plurality of branch gas-supply pipelines;
   the pneumatic switch valve is provided on the control pipeline or on the plurality of branch gas-supply pipelines, or provided simultaneously on the control pipeline and on the plurality of branch gas-supply pipelines.

4. The mask-mounting apparatus for an exposure machine according to claim 3, wherein the control pipeline is further provided thereon with a vent valve, a master pressure-reducing valve and a master pressure gauge.

5. The mask-mounting apparatus for an exposure machine according to claim 4, wherein the vent valve, the master pressure-reducing valve and the master pressure gauge are provided at an end of the control pipeline proximate to the gas-supply unit; a master pneumatic switch valve is provided at the end of the control pipeline proximate to the gas cells.

6. The mask-mounting apparatus for an exposure machine according to claim 3, wherein the plurality of branch gas-supply pipelines are further provided thereon with a pressure-reducing valve and a pressure gauge.

7. The mask-mounting apparatus for an exposure machine according to claim 6, wherein the pressure-reducing valve and the pressure gauge are provided at an end of at least one of the branch gas-supply pipelines proximate to the gas supply unit; and a branch pneumatic switch valve is provided at an end of at least one of the branch gas-supply pipelines proximate to a corresponding gas cell.

8. The mask-mounting apparatus for an exposure machine according to claim 2, further comprising a support portion, wherein the support portion is provided at a lower edge of the mask, configured for supporting the mask;

the support portion is connected through a link rod to a piston of a cylinder, the cylinder is a self-locking cylinder, extension and retraction activities of the cylinder piston pulls the support portion to approach to or to depart from the mask.

9. The mask-mounting apparatus for an exposure machine according to claim 2, wherein the mask frame is provided therein with a vacuum adsorption holder for securing the mask.

10. The mask-mounting apparatus for an exposure machine according to claim 1, wherein the gas-supply pipeline comprises: a control pipeline and a plurality of branch gas-supply pipelines, the branch gas-supply pipelines communicate with the gas cell, and the control pipeline communicates with the gas-supply unit and the plurality of branch gas-supply pipelines;

the pneumatic switch valve is provided on the control pipeline or on the plurality of branch gas-supply pipelines, or provided simultaneously on the control pipeline and on the plurality of branch gas-supply pipelines.

11. The mask-mounting apparatus for an exposure machine according to claim 10, wherein the control pipeline is further provided thereon with a vent valve, a master pressure-reducing valve and a master pressure gauge.

12. The mask-mounting apparatus for an exposure machine according to claim 11, wherein the vent valve, the master pressure-reducing valve and the master pressure gauge are provided at an end of the control pipeline proximate to the gas-supply unit; and a master pneumatic switch valve is provided at the end of the control pipeline proximate to the gas cell.

13. The mask-mounting apparatus for an exposure machine according to claim 11, further comprising a support portion, wherein the support portion is provided at a lower edge of the mask, configured for supporting the mask;

the support portion is connected through a link rod to a piston of a cylinder, the cylinder is a self-locking cylinder, extension and retraction activities of the cylinder piston pulls the support portion to approach to or to depart from the mask.

14. The mask-mounting apparatus for an exposure machine according to claim 10, wherein the plurality of branch gas-supply pipelines are further provided thereon with a pressure-reducing valve and a pressure gauge.

15. The mask-mounting apparatus for an exposure machine according to claim 14, wherein the pressure-reducing valve and the pressure gauge are provided at the end of the branch gas-supply pipeline proximate to the gas-supply unit; and a branch pneumatic switch valve is provided at an end of the branch gas-supply pipeline proximate to the gas cell.

16. The mask-mounting apparatus for an exposure machine according to claim 10, further comprising a support portion, wherein the support portion is provided at a lower edge of the mask, configured for supporting the mask;

the support portion is connected through a link rod to a piston of a cylinder, the cylinder is a self-locking cylinder, extension and retraction activities of the cylinder piston pulls the support portion to approach to or to depart from the mask.

17. The mask-mounting apparatus for an exposure machine according to claim 10, wherein the mask frame is provided therein with a vacuum adsorption holder for securing the mask.

18. The mask-mounting apparatus for an exposure machine according to claim 1, further comprising a support portion, wherein the support portion is provided at a lower edge of the mask, configured for supporting the mask;

the support portion is connected through a link rod to a piston of a cylinder, the cylinder is a self-locking cylinder, extension and retraction activities of the cylinder piston pulls the support portion to approach to or to depart from the mask.

19. The mask-mounting apparatus for an exposure machine according to claim 18, wherein the cylinder is supplied with compressed gas by the gas-supply unit.

20. The mask-mounting apparatus for an exposure machine according to claim 1, wherein the mask frame is provided therein with a vacuum adsorption holder for securing the mask.

* * * * *